(12) United States Patent
Fu-Chin

(10) Patent No.: US 6,876,216 B2
(45) Date of Patent: Apr. 5, 2005

(54) INTEGRATED CIRCUIT PROBE CARD

(75) Inventor: Lu Fu-Chin, Magung (TW)

(73) Assignee: MJC Probe Incorporation, Hsinchu (TW)

( * ) Notice: Subject to any disclaimer, the term of this patent is extended or adjusted under 35 U.S.C. 154(b) by 2 days.

(21) Appl. No.: 10/707,507

(22) Filed: Dec. 18, 2003

(65) Prior Publication Data
US 2004/0232925 A1 Nov. 25, 2004

(30) Foreign Application Priority Data
May 21, 2003 (TW) ........................................ 92209344 U

(51) Int. Cl.[7] .............................................. G01R 31/02
(52) U.S. Cl. ...................... 324/758; 324/158.1; 324/754
(58) Field of Search ................................. 324/758, 754, 324/158.1, 765, 755, 72.5, 761, 762; 439/482, 700; 438/14, 17, 18; 365/201; 29/840

(56) References Cited
U.S. PATENT DOCUMENTS 3,806,801 A    4/1974 Bove
3,963,986 A  *  6/1976 Morton et al. ............... 324/765
6,246,245 B1 *  6/2001 Akram et al. ................ 324/754
6,552,555 B1 *  4/2003 Nuytkens et al. ........... 324/754

* cited by examiner

Primary Examiner—Evan Pert
Assistant Examiner—Jimmy Nguyen
(74) Attorney, Agent, or Firm—Connolly Bove Lodge & Hutz LLP; Larry J. Hume

(57) ABSTRACT

An integrated circuit probe card comprises a circuit board and a plurality of probes provided with a first pitch between them. The circuit board is constituted by a plurality of laminates and comprises an upper surface and a bottom surface a plurality of testing pads provided on the upper surface with a second pitch between them. Besides, the circuit board can further comprise a plurality of electronic devices provided on the upper surface for processing signals. The plurality of testing pads are connected to the bottom surface by the use of the plurality of conductive wires. The plurality of probes are provided wits a first pitch and connected to the conductive wire on the bottom surface of the circuit board, wherein the first pitch is smaller than the second pitch.

6 Claims, 5 Drawing Sheets

INTEGRATED CIRCUIT PROBE CARD

FIELD OF INVENTION

The invention relates to an integrated circuit probe card, and more particularly, to an integrated circuit probe card using two-piece configuration and can be applied to the testing of an integrated circuit with high pad counts.

DESCRIPTION OF RELATED ART

Generally speaking, before an integrated circuit device is packaged, a testing process is performed to verify the electrical properties of the integrated circuit device on a wafer. The integrated circuit devices that meet the specifications of the electrical properties are separated for the subsequent packaging process, while others that do not meet the specifications are abandoned to cut the packaging cost.

FIG. 1 is a schematic cross-sectional view of an integrated circuit probe card 10 according to the prior art. As shown in FIG. 1, the integrated circuit probe card 10 using three-piece configuration consists of a printed circuit board 20, a ceramic substrate 30 and a probe contactor 40. The printed circuit board 20 comprises a plurality of pads 22 and a plurality of conductive wires 24 electrically connecting the pads 22 to a test machine (not shown in FIG. 1). The probe contactor 40 comprises a plurality of probes 42, which is used to contact an integrated circuit device under test (DUT) and acquire the electrical properties thereof. The ceramic substrate 30 comprises a plurality of upper pads 32 provided on the upper surface and a plurality of bottom pads 34 provided on the bottom surface. The pitch between the upper pads 32 is approximately the same as that between the pads 22 on the printed circuit board 20 and the pitch between the bottom pads 34 corresponds to the pitch between the probes 42 of the probe contactor 40. The pitch between the upper pads 32 is larger than that between the bottom pads 34 of the ceramic substrate 30, and the pitch between the pads 22 on the printed circuit board 20 is ten times larger than the pitch between the probe 42 of the probe contactor 40. An electric testing signal from the test machine will be transmitted to pad 22 via wires of the printed circuit board 20, wherein the processing of impedance matching, anti-reflection, anti-degenerating and anti-disturbance are performed through the wire distribution in the printed circuit board 20. The testing signal is then transmitted to the integrated circuit probe card 10 through the pads 22 on the printed circuit board 20, the upper pad 32 and the bottom pad 34 of the ceramic substrate 30, and the probe 42.

FIG. 2 is a schematic-cross-sectional view of the ceramic substrate 30 and the probe contactor 40 according to the prior art. As shown in FIG. 2, the probe 42 of the probe contactor 40 is provided in a sleeve 44, which allows the probe 42 to move up and down, and is electrically connected to the bottom pad 34 of the ceramic substrate 30 by a solder 36. The bottom pad 34 is electrically connected to the upper pads 32 via an inner conductive wire 38 of the ceramic substrate 30. The solder 36 is first formed on the bottom pad 34 and then a reflow process is performed at 220° C. to solder the sleeve 44 so that the probe contactor 40 is connected to the ceramic substrate 30. Similarly, the pad 22 of the printed circuit board 20 is soldered to the upper pad 32 of the ceramic substrate 30 by a reflow process to connect the printed circuit board 20 to the ceramic substrate 30.

The conventional probe card 10 using three-piece configuration, which consists of the printed circuit board 20, the ceramic substrate 30 and the probe contactor 40, possesses the following disadvantages:

1. Since the printed circuit board 20 is made of polyimide or FR-4, which will deform and become defective when the reflow process at 220° C. is performed, the conductive wire 24 on the printed circuit board 20 is subject to damage which will affect the electrical properties of the printed circuit board 20.
2. As the solder is used in the reflow process to connect the printed circuit board 20, the ceramic substrate 30 and the probe contactor 40, impurities are subject to get into the molten solder in the reflow process. These impurities may change the resistance of the solder and further influence the electrical properties of the probe card 10.
3. It is very difficult to control the relative horizontal positions of the printed circuit board 20, the ceramic substrate 30 and the probe contactor 40 after the reflow process. If the variation of the horizontal position exceeds a predetermined range, the force applied to the integrated circuit device under test is not uniform that may destroy the integrated circuit device.
4. The probe 42 can move up and down in the sleeve 44 during the testing process to electrically connect an integrated circuit device under test and the bottom pad 34. However, since the probe 42 hits the solder 36 and the bottom pad 34 during the vertical movement to up and down, the solder 36 and the bottom pad 34 tend to peel off, thereby, the circuit becomes open, and the probe card 10 becomes fails the test.
5. The size of a current ceramic substrate 30 that is used currently in the industries is between 30×30 mm and 80×80 mm, and the pitch between the bottom pad 34 shrinks as the number of the probes 42 of the probe contactor 40 increases. As the number of the probes 42 exceeds 3000, it is difficult to electrically isolate the bottom pad 34 since the pitch between them is too small, i.e., the conventional design can not be applied to the test of an integrated circuit device with high pad counts.

SUMMARY OF THE INVENTION

The objective of the invention is to provide an integrated circuit probe card using two-piece configuration, which can be applied to the testing of an integrated circuit with high pad counts.

In order to achieve the above-mentioned objective and avoid the problems of the prior art, the invention provides an integrated circuit probe card comprising a circuit board and a plurality of probes provided with a first pitch between them. The circuit board comprises an upper surface and a bottom surface, a plurality of testing pads provided on the upper surface with a second pitch between them, and a plurality of conductive wires provided inside the circuit board for connecting the testing pads to the bottom surface. The testing pads on the upper surface can electrically connect to a test machine and the probe can electrically connect to the conductive wire. The first pitch is smaller than the second pitch, and approximately equal to the pitch between signal pads of an integrated circuit device under test. Also, the circuit board can further comprise a plurality of electronic devices provided on the upper surface for processing testing signals.

The invention as compared with the prior art, possesses the following advantages:

1. Unlike the conventional probe card that uses three-piece configuration, the integrated circuit probe card of the invention uses two-piece configuration that consists of the circuit board and the probe contactor. That is, the invention incorporates the function of the conventional ceramic substrate in the circuit board.

2. The entire surface of the circuit board is available for allocating circuits according to the invention, while there is only 80 mm (the width of the ceramic substrate) for allocating circuits according to the prior art. Obviously, the circuit board of the invention can accommodate a probe contactor with high density; high pin counts to test an integrated circuit device with high integrity.
3. Since the circuit board of the invention can be manufactured by a circuit fabrication process at a lower temperature, the invention can prevent the material of the circuit board from thermal decay and deformation so as to avoid the failure of the probe card due to the reflow process at high temperature.
4. The probe is directly in contact with the conductive wires on the bottom surface of the circuit board, therefore the invention can avoid the peeling off of the solder and the variation of the resistance originating from the connection between the solder and the pads.

DESCRIPTION OF THE DRAWINGS

Other objectives and advantages of the invention will become apparent upon reading the following description and upon reference to the accompanying drawings in which.

DETAILED DESCRIPTION OF THE INVENTION

Figure 1:
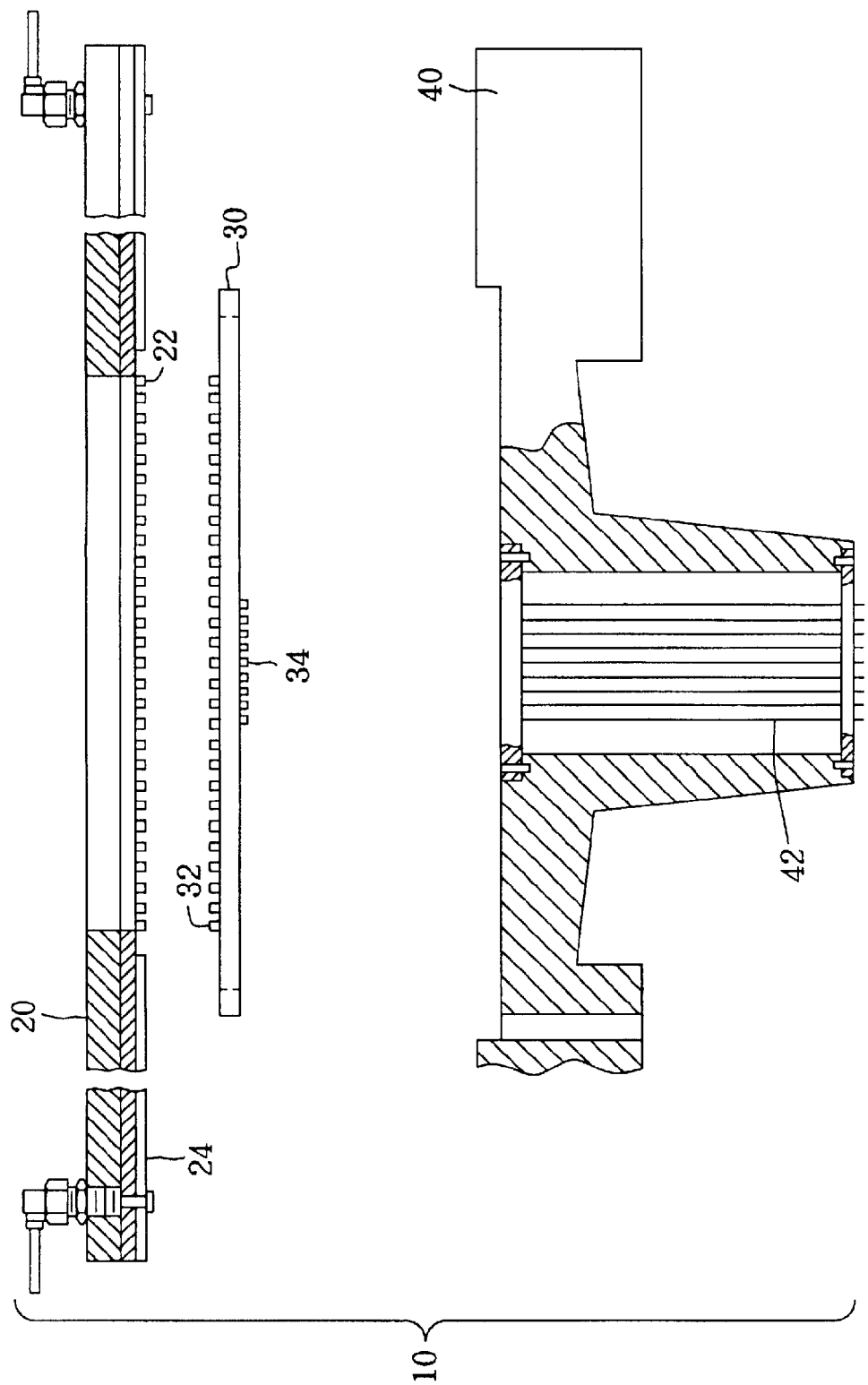
FIG. 1 is a schematic cross-sectional view of an integrated circuit probe card according to the prior art.
Figure 2:
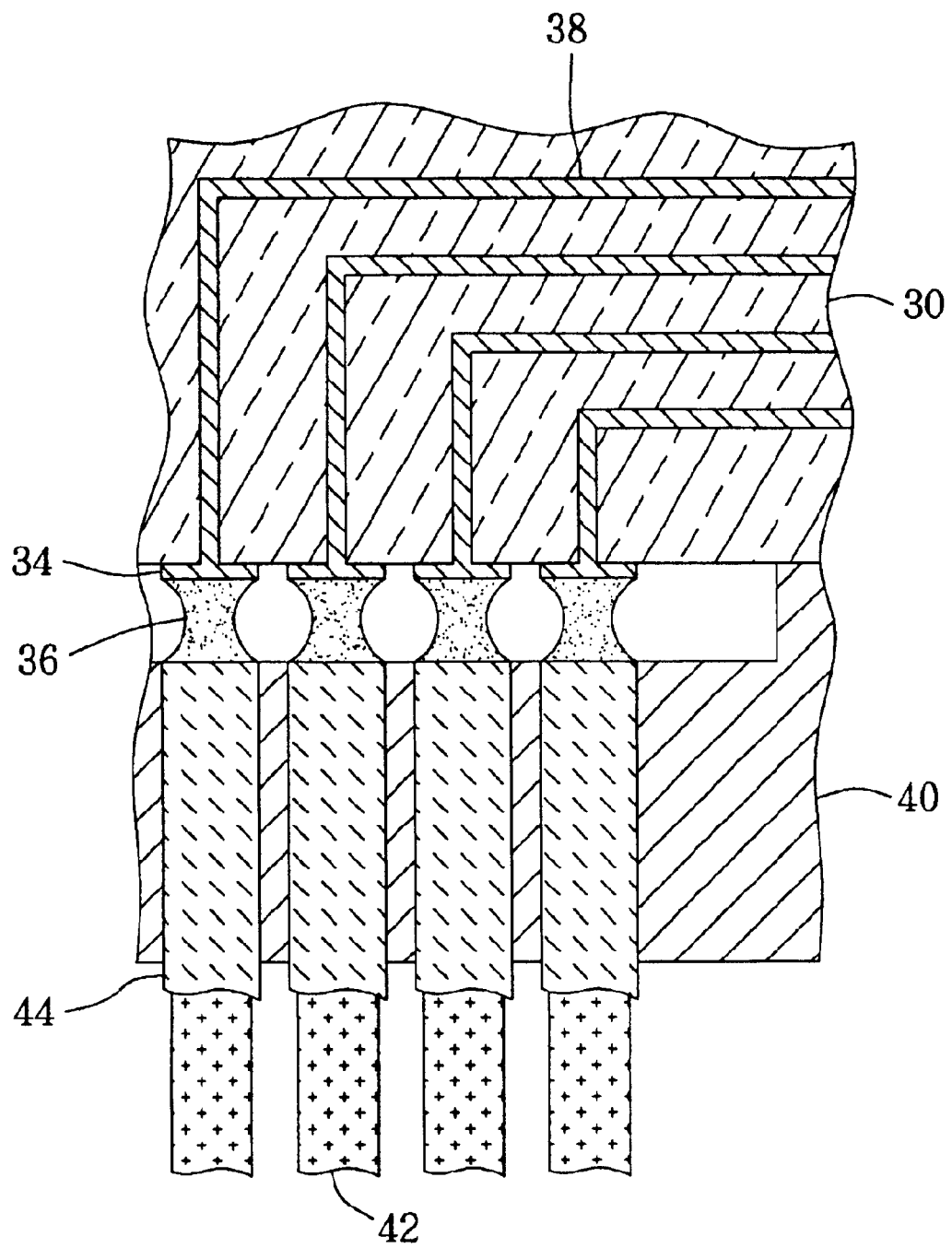
FIG. 2 is a schematic cross-sectional view of the ceramic substrate and the probe contactor.
Figure 3:
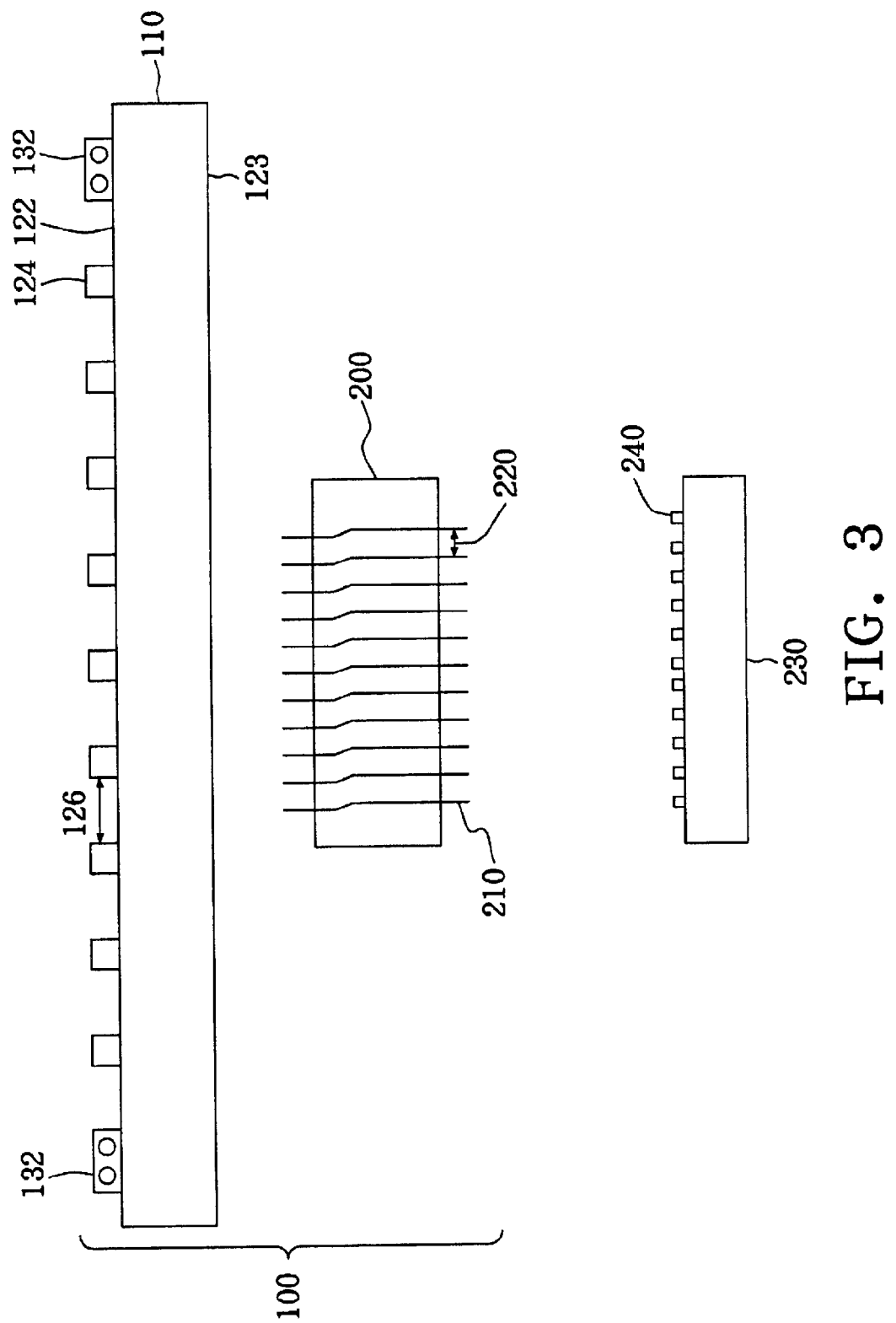
FIG. 3 is a schematic cross-sectional view of an integrated circuit probe card according to the invention.

FIG. 3 is a schematic cross-sectional view of an integrated circuit probe card 100 according to the invention. As shown in FIG. 3, the integrated circuit probe card 100 comprises a circuit board 110 and a probe contactor 200. The thickness of the circuit board 110 can be in a range between 4.80 mm and 6.35 mm, and the width can be in a range between 9 inch and 12 inch according to the current fabrication technology. The circuit board 110 can be designed to be any shape, such as circular with a diameter between 9 inch and 12 inch. The probe contactor 200 comprises a plurality of probe 210 provided with a first pitch 220 between them. The first pitch 220 is smaller than 400 micrometer, and approximately the same as the pitch between signal pads 240 on an integrated circuit device under test 230. The probe 210 can electrically connect to the integrated circuit device under test 230 and pick up the electrical properties.

The circuit board 110 comprises an upper surface 122 and a bottom surface 123, a plurality of testing pads 124 provided on the upper surface 122 for electrical connecting to a test machine directly (not shown in FIG. 3). In addition, the circuit board 110 can further comprise a plurality of electronic devices 132, such as a capacitor, a resistance, or an inductance, provided on the upper surface 122 for processing testing signal or impedance matching. The testing pads 124 are separated by a second pitch 126, whose size can be designed according to the specification of the test machine. The second pitch 126 separating the testing pads 124 is larger than the first 220 separating the probe 210.

Figure 4:
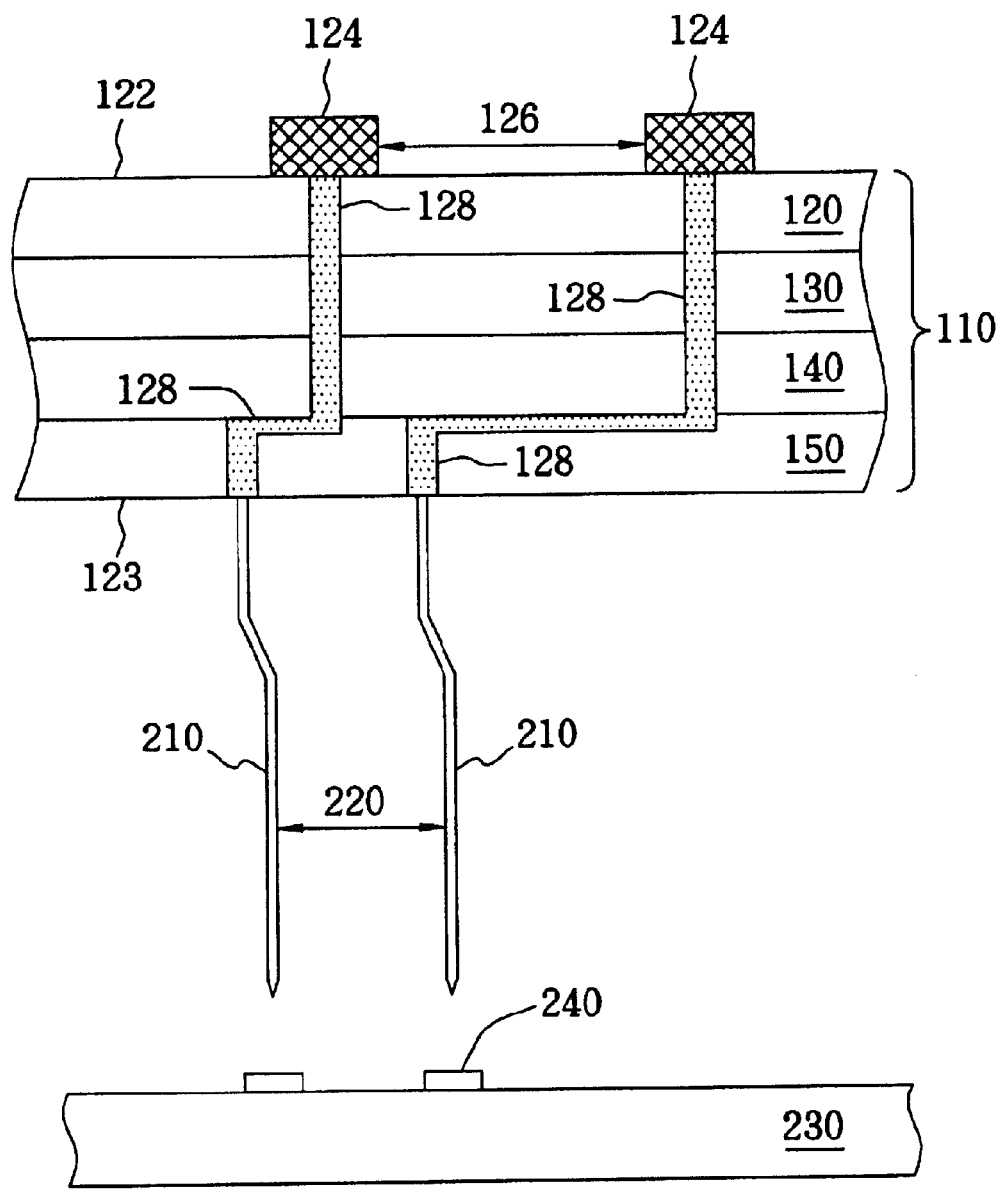
FIG. 4 is a close-up fragmentary view of an integrated circuit probe card according to the invention.

FIG. 4 is a close-up fragmentary view of the integrated circuit probe card 100 according to the invention. As shown in FIG. 4, the circuit board 110 consists of four laminates 120, 130, 140 and 150 with a plurality of conductive wires 128 connecting the testing pad 124 and the probe 210. The probe 210 is directly connected to the conductive wires 128 on the bottom surface 123 of the circuit board 110. A testing signal from the test machine is transmitted to the integrated circuit under test via the testing pad 124, the conductive wires 128 and the probe 210.

Figure 5:
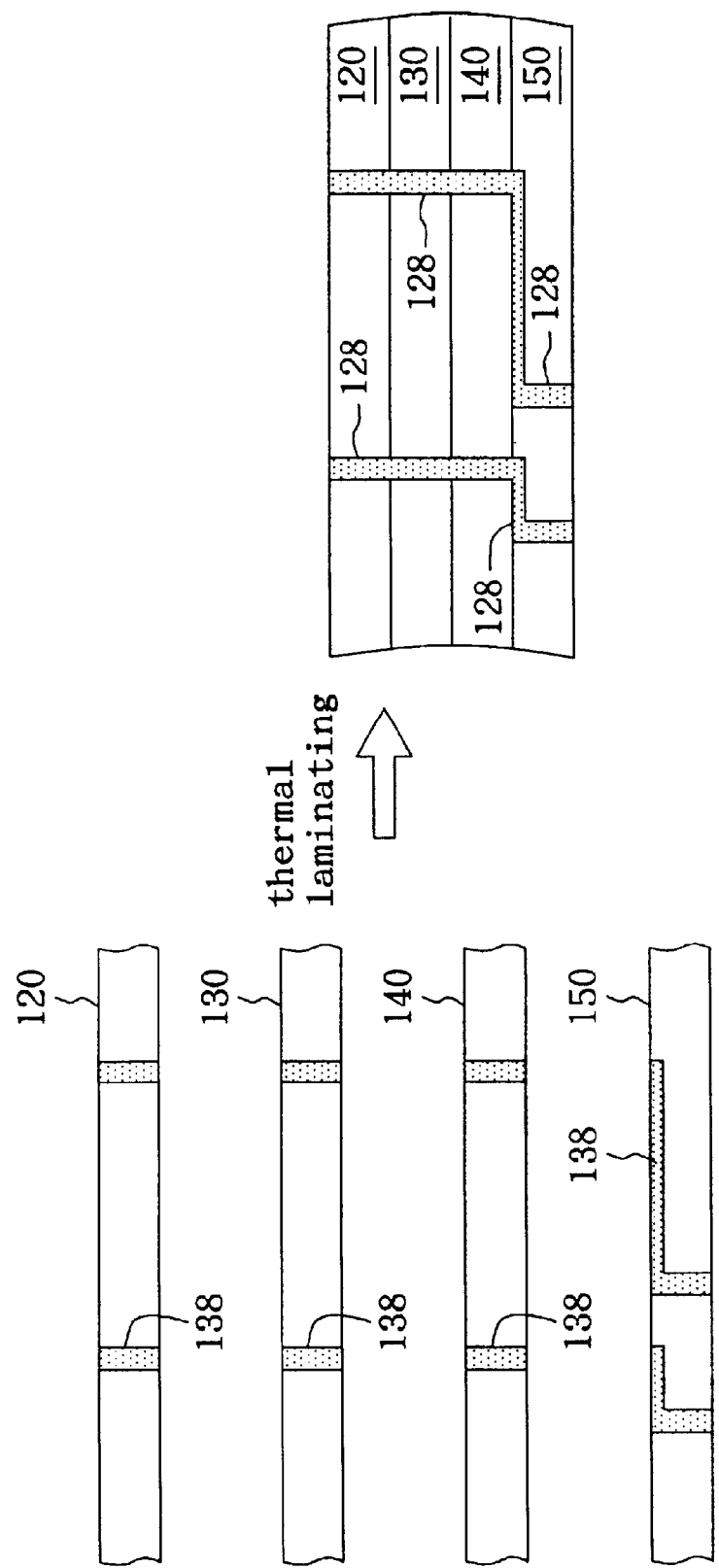
FIG. 5 is a schematic diagram showing the fabrication of the circuit board according to the invention.

FIG. 5 is a schematic diagram showing the fabrication of the circuit board 110 according to the invention. As shown in FIG. 5, the circuit board 110 is manufactured by thermally laminating four pieces of laminates 120, 130, 140 and 150. The laminates 120, 130, 140 and 150 can be made of polyimide or FR-4, and a conductive metal 138 is formed inside in advance. The pitch between the conductive metal 138 of the uppermost laminate 120 corresponds to the second pitch 126 separating the testing pads 124, while the pitch between the conductive metal 138 of the bottommost laminate 150 corresponds to the first pitch 220 separating the probes 210. Although the four pieces of laminates shown in FIG. 5 are used for pitch adjusting, impedance matching, anti-reflection, anti-degenerating and anti-disturbance, one skilled in the art should appreciate that the invention can use laminates other than four pieces for pitch adjusting and impedance matching. After the laminates 120, 130, 140 and 150 are completed, a thermal laminating process is performed to laminate the pieces 120, 130, 140 and 150 into the circuit board 110, wherein the conductive metal 138 in each laminate consists of the conductive wire 128 of the circuit board. 110.

Compared with the prior art, the invention possesses the following advantages:
1. The integrated circuit probe card of the invention uses two-piece configuration, which consists of the circuit board and the probe contactor, while the conventional probe card uses three-piece configuration. The invention integrates the function of the conventional ceramic substrate into the circuit board.
2. The entire surface of the circuit board is available for allocating circuits according to the invention, while there is only 80 mm (the width of the ceramic substrate) for allocating circuits according to the prior art. Obviously, the circuit board of the invention can accommodate a probe contactor with high density, high pin counts to test an integrated circuit device with high integrity.
3. Since the circuit board of the invention can be manufactured by a circuit fabrication process at a lower temperature, the invention can prevent the material of the circuit board from thermal decay and deformation so as to avoid the failure of the probe card due to the reflow process at a high temperature
4. The probe is directly in contact with the conductive wires on the bottom surface of the circuit board, therefore the invention can avoid the peeling of the solder and the variation of the resistance originating from the connection between the solder and the pads.

The above-described embodiments of the invention are intended to be illustrative only. Numerous alternative embodiments may be devised by those skilled in the art without departing from the scope of the following claims.

What is claimed is:
1. An integrated circuit probe card comprising:
   a plurality of probes separated by a first pitch;
   a circuit board including a plurality of laminates and having an upper surface and a bottom surface, comprising;
   a plurality of testing pads provided on the upper surface and sepal by a second pitch larger th the first pitch, and being able to be electrically connected to a test machine directly; and a plurality of conductive wires provided inside the circuit board;

wherein the conducive wires are separated by the second pitch in an uppermost laminate and seated by the first pitch in a bottommost laminate for electrically connecting the testing pads to the probes.

2. The integrated circuit probe card of claim 1, wherein the circuit board is constituted by tightly stacking up a plurality of laminates.

3. The integrated circuit probe card of claim 1, wherein the circuit board can further comprises a plurality of electronic devices provided on the upper surface for processing testing signals.

4. The integrated circuit probe card of claim 1, wherein the first pitch is smaller than 400 micrometer.

5. The integrated circuit probe card of claim 1, wherein the plurality of probes are directly in contact with the conductive wires.

6. The integrated circuit probe card of claim 1, wherein the first pitch is approximately the same as the pitch between signal pads of an integrated circuit device under test.

* * * * *